United States Patent
Kobayashi et al.

(10) Patent No.: US 11,466,170 B2
(45) Date of Patent: Oct. 11, 2022

(54) CONDUCTIVE PASTE

(71) Applicant: NAMICS CORPORATION, Niigata (JP)

(72) Inventors: Kenji Kobayashi, Niigata (JP); Kazuo Muramatsu, Niigata (JP); Hideo Tanabe, Niigata (JP)

(73) Assignee: NAMICS CORPORATION, Niigata (JP)

( * ) Notice: Subject to any disclaimer, the term of this patent is extended or adjusted under 35 U.S.C. 154(b) by 0 days.

(21) Appl. No.: 16/768,749

(22) PCT Filed: Nov. 7, 2018

(86) PCT No.: PCT/JP2018/041301
§ 371 (c)(1),
(2) Date: Jun. 1, 2020

(87) PCT Pub. No.: WO2019/111623
PCT Pub. Date: Jun. 13, 2019

(65) Prior Publication Data
US 2021/0155819 A1    May 27, 2021

(30) Foreign Application Priority Data
Dec. 6, 2017 (JP) .............................. JP2017-234123

(51) Int. Cl.
*C09D 11/52* (2014.01)
*C09D 11/033* (2014.01)
(Continued)

(52) U.S. Cl.
CPC ............ *C09D 11/52* (2013.01); *C09D 11/033* (2013.01); *C09D 11/037* (2013.01);
(Continued)

(58) Field of Classification Search
CPC ....................................................... C09D 11/52
See application file for complete search history.

(56) References Cited

U.S. PATENT DOCUMENTS 4,587,038 A * 5/1986 Tamura .................. B82Y 10/00
                                                         252/511
4,859,364 A * 8/1989 Yamamoto ............ B22F 1/0003
                                                         252/512
(Continued)

FOREIGN PATENT DOCUMENTS

CN         106165024 A      11/2016
EP         3125254 A1       2/2017
(Continued)

OTHER PUBLICATIONS

International Search Report (ISR) (and English translation thereof) dated Feb. 5, 2019 issued in International Application No. PCT/JP2018/041301.
(Continued)

*Primary Examiner* — William D Young
(74) *Attorney, Agent, or Firm* — Holtz, Holtz & Volek PC

(57) ABSTRACT

A conductive paste, for forming an electrode of a solar cell, includes (A) a conductive component, (B) an epoxy resin, (C) an imidazole and (D) a solvent. An amount of (C) the imidazole in the conductive paste is 0.1 to 1.0% by weight based on 100% by weight of the conductive paste excluding (D) the solvent.

7 Claims, 2 Drawing Sheets

(51) Int. Cl.
*C09D 11/037* (2014.01)
*C09D 11/102* (2014.01)
*H01L 31/0224* (2006.01)
*H01L 31/0747* (2012.01)

(52) U.S. Cl.
CPC .... *C09D 11/102* (2013.01); *H01L 31/022466* (2013.01); *H01L 31/0747* (2013.01)

(56) References Cited

U.S. PATENT DOCUMENTS

| | | | |
|---|---|---|---|
| 2002/0096663 A1* | 7/2002 | Sato | C03C 8/18 252/500 |
| 2012/0119153 A1* | 5/2012 | Choi | H01L 31/022425 252/500 |
| 2013/0333744 A1 | 12/2013 | Yokochi et al. | |
| 2016/0240278 A1* | 8/2016 | Lee | C09J 7/10 |
| 2017/0103824 A1* | 4/2017 | Higano | H01B 1/02 |
| 2018/0061520 A1* | 3/2018 | Kajita | H01L 21/4867 |

FOREIGN PATENT DOCUMENTS

| | | |
|---|---|---|
| JP | H05171073 A | 7/1993 |
| JP | H0892506 A | 4/1996 |
| JP | 2002161123 A | 6/2002 |
| JP | 2007224191 A | 9/2007 |
| JP | 2010087131 A | 4/2010 |
| JP | 2010090211 A | 4/2010 |
| JP | 2011071057 A | 4/2011 |
| JP | 2013149596 A | 8/2013 |
| JP | 2013196954 A | 9/2013 |
| JP | 2014089818 A | 5/2014 |
| TW | 201233763 A | 8/2012 |

OTHER PUBLICATIONS

Written Opinion dated Feb. 5, 2019 issued in International Application No. PCT/JP2018/041301.
Extended European Search Report (EESR) dated Jul. 20, 2021 issued in counterpart European Application No. 18886025.8.
Taiwanese Office Action dated Mar. 17, 2022, issued in counterpart Taiwanese Application No. 107139504.

* cited by examiner

CONDUCTIVE PASTE

TECHNICAL FIELD

The present invention relates to a conductive paste capable of obtaining a conductive pattern excellent in electric characteristics. Specifically, it relates to a conductive paste capable of using for forming an electrode of a semiconductor device such as a solar cell and the like.

BACKGROUND ART

A conductive paste containing silver particles has been used, for example, for forming an electrode of a semiconductor device and electronic parts, and a circuit pattern. Formation of an electrode and a circuit pattern by the conductive paste can be carried out by coating a conductive paste with a predetermined pattern on a substrate or the like by a screen printing method or the like, and then, heating the conductive paste to obtain a conductive film having a predetermined pattern.

There are two types of the conductive pastes that are a high temperature firing conductive paste and a thermosetting conductive paste. The high temperature firing conductive paste is a paste that can form a conductive film by firing at a high temperature of about 550 to 900° C. In the case of the high temperature firing conductive paste, the resin component contained in the conductive paste is burned off during firing. The thermosetting conductive paste is a paste that can form a conductive film by heating at a relatively low temperature of room temperature (about 20° C.) to about 250° C. In the case of thermosetting conductive paste, a conductive film is formed by curing the resin component to bond silver particles to each other.

As an example of the conductive paste, Patent Document 1 discloses a conductive paste which contains an epoxy resin having a molecular weight of 900 or more, a silver powder having a weight ratio in the range of 4 to 10 based on the weight of the epoxy resin, and an imidazole-based curing agent with an addition amount twice or more of the minimum addition amount necessary for curing the epoxy resin.

Patent Document 2 discloses a conductive ink composition containing conductive particles, and an organic vehicle containing a heat-curable resin composition, a curing agent and a solvent. The conductive particles contained in the conductive ink composition of Patent Document 2 contain spherical conductive particles having an average particle diameter of 0.1 to 3 μm and flaky conductive particles having an average particle diameter of 0.1 μm or more and less than 3 μm.

The conductive particles contained in the conductive ink composition of Patent Document 2 contain the flaky conductive particles in a larger or the same mass proportion as that of the spherical conductive particles. In addition, Patent Document 2 discloses that 2-ethyl-4-methylimidazole which is an imidazole-based curing agent is used as a curing agent.

Patent Document 3 discloses a heat-curable conductive paste composition containing a conductive powder, a thermosetting component, a curing agent and a solvent. Specifically, Patent Document 3 discloses that flaky powder and spherical powder are used as the above-described conductive powder. In addition, Patent Document 3 discloses that as a thermosetting component, two kinds of epoxy resins having a predetermined epoxy equivalent and a predetermined viscosity are formulated with a predetermined mass ratio. Further, Patent Document 3 discloses that imidazoles are used as a curing agent.

PRIOR ART DOCUMENTS

Patent Documents

Patent Document 1: JP Hei.08-092506A
Patent Document 2: JP 2010-087131A
Patent Document 3: JP 2013-196954A

DISCLOSURE OF THE INVENTION

Problems to be Solved by the Invention

The thermosetting conductive paste generally uses an epoxy resin as a binder. A conductive film obtained by using the thermosetting conductive paste tends to have a higher specific resistance (electric resistance value) than that of a conductive film obtained by using a high temperature firing conductive paste. For achieving both of good adhesiveness and electric characteristics (specific resistance of 10 μΩ·cm or less), heat treatment at a high temperature of exceeding 250° C. is generally required.

The thermosetting conductive paste is sometimes used for forming an electrode of a solar cell. In order to obtain a solar cell having high conversion efficiency, formation of an electrode having a low specific resistance is required. Also, depending on the kind of solar cells, there is a case that a material that is adversely affected by a high temperature heating process is used. In the case of such a solar cell, an electrode having a low specific resistance is required to be formed at a low temperature of, for example, 250° C. or lower.

An object of the present invention is to provide a conductive paste for forming an electrode for a solar cell, which can be processed at a low temperature (for example, 250° C. or lower), and can form a conductive film having a low specific resistance.

Means for Solving the Problems

In order to solve the above-described problems, the present invention has following configurations.

(Configuration 1)

Configuration 1 of the present invention is a conductive paste for forming an electrode for a solar cell, wherein the conductive paste comprises (A) a conductive component, (B) an epoxy resin, (C) an imidazole and (D) a solvent, and an amount of (C) the imidazole in the conductive paste is 0.1 to 1.0% by weight based on 100% by weight of the conductive paste excluding (D) the solvent.

According to Configuration 1 of the present invention, a conductive paste for forming an electrode for a solar cell capable of being processed at a low temperature (for example, 250° C. or lower), and capable of forming a conductive film (for example, electrodes of a solar cell) having low specific resistance can be provided.

(Configuration 2)

Configuration 2 of the present invention is the conductive paste of Configuration 1, wherein (C) the imidazole contains at least one selected from imidazoles of formula (1), formula (2) and formula (3).

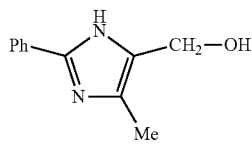

Formula (1)

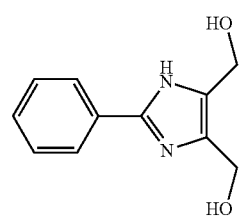

Formula (2)

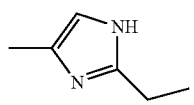

Formula (3)

According to Configuration 2 of the present invention, since the conductive paste of the present invention contains at least one selected from imidazoles of the formula (1), the formula (2) and the formula (3), specific resistance of the obtainable conductive film (for example, an electrode of a solar cell) can be low.

(Configuration 3)

Configuration 3 of the present invention is the conductive paste of Configuration 1 or 2, wherein (B) the epoxy resin contains at least one selected from a bisphenol F type epoxy resin, a biphenyl type epoxy resin and a bisphenol A type epoxy resin.

According to Configuration 3 of the present invention, by using the predetermined epoxy resin as (B) the epoxy resin, the thermosetting resin can be thermally cured at a low temperature (for example, 250° C. or lower).

(Configuration 4)

Configuration 4 of the present invention is the conductive paste of any of Configurations 1 to 3, wherein (D) the solvent contains ethyl diglycol monophenyl ether or butyl carbitol.

According to Configuration 4 of the present invention, by containing ethyl diglycol monophenyl ether or butyl carbitol as (D) the solvent, it can be more assured to obtain a conductive film (for example, an electrode of a solar cell) having a low specific resistance.

(Configuration 5)

Configuration 5 of the present invention is the conductive paste of any of Configurations 1 to 4, wherein the conductive paste further comprises (E) a phenol resin.

According to Configuration 5 of the present invention, by further containing (E) a phenol resin in the conductive paste, thermal curing of a thermosetting resin at a low temperature (for example, 250° C. or lower) can be more assured.

(Configuration 6)

Configuration 6 of the present invention is the conductive paste of any of Configurations 1 to 5, wherein the conductive paste further comprises (F) a coupling agent.

According to Configuration 6 of the present invention, by further containing a coupling agent in the conductive paste, adhesiveness of an inorganic component such as a conductive component or the like, and a thermosetting resin can be better.

Effects of the Invention

According to the present invention, a conductive paste for forming an electrode of a solar cell capable of processing at a low temperature (for example, 250° C. or lower) and capable of forming a conductive film having a low specific resistance can be provided.

MODE FOR CARRYING OUT THE INVENTION

Figure 1:
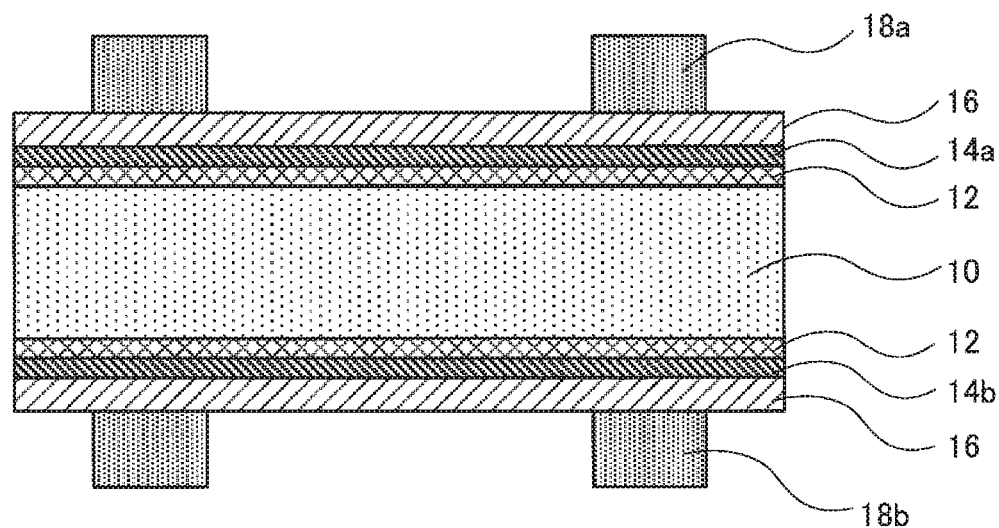
FIG. 1 is a cross-sectional schematic diagram showing an example of a solar cell having an electrode formed by using a conductive paste.

In the following, embodiments of the present invention will be specifically explained by referring to the drawings. The following embodiments show embodiments for specifying the present invention, and do not limit the present invention within the scope thereof.

The conductive paste of the present invention is a thermosetting conductive paste. In the conductive paste of the present invention, by containing a predetermined components, it is possible to form an electrode by thermally curing at a low temperature (for example, 250° C. or lower). In addition, by using the conductive paste of the present invention, a conductive film (electrode) having a low specific resistance can be obtained. The conductive paste of the present invention can be preferably used as a conductive paste for forming an electrode of a solar cell.

In the present specification, the "conductive film" refers to a thin film state pattern which is obtained by printing a conductive paste on a surface of a predetermined substrate or the like so as to form a pattern having a predetermined shape, and curing the paste. The pattern having a predetermined shape includes a pattern having an arbitrary shape, for example, a linear shape, a dot shape and a planar shape.

The conductive paste of the present invention can be used for forming an electrode of a semiconductor device, electronic parts and the like, and a conductive film as a circuit pattern. The conductive paste of the present invention can be used for forming an electrode and/or a circuit pattern not only on the surface of an inorganic material such as a semiconductor, an oxide, a ceramic and the like, but also a substrate having a low heat resistance such as PET (polyethylene terephthalate), PEN (polyethylene naphthalate) and the like.

In the present specification, a "semiconductor device" refers to a device using a semiconductor, for example, a device using a semiconductor chip such as a transistor, an integrated circuit, and the like, a flat panel display such as a liquid crystal display (LCD), a plasma display panel (PDP) and the like, and a solar cell, and the like. The semiconductor device is a device utilizing the properties of electrons and holes in a semiconductor, and has an electrode for direct or indirect electrical connection to the semiconductor.

There is a case that the electrode of the semiconductor device requires transmission of light. A transparent conductive film is used as a material for such an electrode. An electrode using a transparent conductive film as a material is called a transparent electrode. The transparent electrode is used for a semiconductor device of a flat panel display such as a liquid crystal display (LCD), a plasma display panel (PDP) and the like, and various kinds of solar cells, and the like. The solar cells may include a thin film solar cell such as an amorphous silicon solar cell, a compound semiconductor solar cell (CIS (CuInSe$_2$) solar cell, CIGS (Copper Indium Gallium Selenide) solar cell, CdTe solar cell and the like) and the like, a heterojunction solar cell, a crystalline silicon solar cell and the like. The transparent electrode is used for forming an electrode of, for example, a flat panel display, a thin film solar cell, a heterojunction solar cell and the like.

As the transparent conductive film that is a material of the transparent electrode, an oxide conductive film can be used. The oxide conductive film may include an indium tin oxide (also called to as "ITO (Indium Tin Oxide)".) thin film, a tin oxide thin film, a ZnO-based thin film and the like. At present, the ITO thin film is used for a flat panel display, various kinds of solar cells and the like in many cases. A lattice (grid) state electrode (It may be simply referred to as an "electrode".) is formed to electrically connect to the transparent electrode without preventing incidence of light into the semiconductor device or emission of light from the semiconductor device. The conductive paste of the present invention can be used for formation of a lattice state electrode on the surface of the transparent electrode.

Depending on the kind of the materials of the semiconductor of the semiconductor device, the kind of the materials of the electronic parts, and the kind of the materials of other than the semiconductor constituting the semiconductor device, the electronic parts and the like, the semiconductor chip and/or the material other than these may be sometimes deteriorated when a processing is carried out in the step of forming the electrode at a high temperature, for example, a temperature exceeding 250° C. By using the conductive paste of the present invention, an electrode having a low specific resistance can be formed at a low temperature (for example, 250° C. or lower). By using the conductive paste of the present invention, an electrode having a predetermined low resistance can be formed without deteriorating the semiconductor device due to high temperature.

When an electrode is formed on a transparent conductive film using the conductive paste of the present invention, a low contact resistance can be obtained. In particular, when an electrode is formed on an ITO thin film, a low contact resistance (for example, a contact resistance of 8 mΩ·cm$^2$ or less) can be relatively easily obtained. Accordingly, the conductive paste of the present invention can be suitably used for forming an electrode on a transparent conductive film, in particular, on an ITO thin film.

The conductive paste of the present invention can be preferably used for forming an electrode on the surface of a transparent conductive film of a solar cell. Depending on the kind of the solar cells, there is a case that a material that is adversely affected by a heating step with a high temperature may be used. The conductive paste of the present invention can be particularly preferably used for forming an electrode on the surface of such a transparent conductive film of a solar cell having a low heat resistance. Amorphous silicon may be a material that is adversely affected by a heating step with a high temperature. As the solar cell using amorphous silicon as a material may include an amorphous silicon solar cell, and a heterojunction solar cell using amorphous silicon and crystalline silicon (hereinafter simply referred to as "heterojunction solar cell"). The conductive paste of the present invention can be preferably used for forming an electrode on the surface of a transparent conductive film of an amorphous silicon solar cell and a heterojunction solar cell.

A heterojunction solar cell that is a preferable application of the conductive paste of the present invention will be explained by referring to FIG. 1.

In FIG. 1, a cross-sectional schematic diagram of an example of a heterojunction solar cell is shown. The heterojunction solar cell shown in FIG. 1 comprises an i-type amorphous silicon layer 12 (film thickness: about 10 nm) comprising intrinsic amorphous silicon and a p-type amorphous silicon layer 14a (film thickness: about 10 nm) comprising p-type amorphous silicon are laminated on the surface of the light incident side of an n-type crystalline silicon substrate 10 (for example, a monocrystalline silicon substrate or a polycrystalline silicon substrate) in this order. A transparent conductive film (for example, a transparent conductive film 16 (film thickness: about 70 nm) comprising indium tin oxide (ITO)) is provided on the p-type amorphous silicon layer 14a. A light incident side electrode 18a with a lattice (grid) state is formed on the surface of the transparent conductive film 16 in order to obtain a slit-shaped light incident side surface.

In addition, as shown in FIG. 1, the i-type amorphous silicon layer 12 (film thickness: about 10 nm) comprising intrinsic amorphous silicon and the n-type amorphous silicon layer 14b (film thickness: about 10 nm) comprising n-type amorphous silicon doped with a high concentration are laminated in this order, on the back surface of the crystalline silicon substrate 10. A transparent conductive film 16 and a lattice state back surface electrode 18b are formed on the n-type amorphous silicon layer 14b, similar to the surface at the light incident side.

In the case of the heterojunction solar cell shown in FIG. 1, all formations of the respective layers other than the crystalline silicon substrate can be carried out at a temperature of about 200° C. or lower using the method such as a plasma CVD method, a sputtering method, a vapor deposition method, a screen printing method or the like. Also, since the amorphous silicon is adversely affected by a heating step at a high temperature, the temperature at the time of forming a light incident side electrode 18a and a back surface electrode 18b on the surface of the transparent conductive film 16 is preferably a low temperature. The light incident side electrode 18a and the back surface electrode 18b having low specific resistances can be formed at a low temperature (for example, 250° C. or lower) by using the conductive paste of the present invention.

Next, the conductive paste of the present invention will be explained.

The conductive paste for forming an electrode of a solar cell of the present invention contains (A) a conductive component, (B) an epoxy resin, (C) an imidazole and (D) a solvent. The conductive paste of the present invention contains 0.1 to 1.0% by weight of (C) the imidazole in the conductive paste based on 100% by weight of the conductive paste excluding (D) the solvent.

According to the conductive paste of the present invention, it is possible to provide a conductive paste for forming an electrode of a solar cell, which is capable of processing at a low temperature (for example, 250° C. or lower), and capable of obtaining a conductive film (for example, an electrode of a solar cell) having a low specific resistance.

<(A) Conductive Component>

The conductive paste of the present invention contains (A) a conductive component.

The conductive component refers to conductive particles containing a conductive component such as silver, copper, nickel, aluminum, zinc and/or tin and the like. A shape of the conductive particles can be, for example, a shape of spherical, flaky, needle or the like. It is possible to use conductive particles having different shapes in admixture.

A method for producing the conductive particles is not particularly limited and the particles can be produced by, for example, a reduction method, a pulverization method, an electrolytic method, an atomizing method, a heat treatment method, or a combination thereof. The flaky conductive particles can be produced by, for example, crushing spherical conductive particles with a ball mill or the like.

In the conductive paste of the present invention, (A) the conductive component is preferably spherical and/or flaky particles.

From the viewpoint of lowering the specific resistance of the conductive film, it is preferable to use flaky conductive particles. However, when only the flaky conductive particles are used, the viscosity of the conductive paste becomes high, and the handling property is worsened (thixotropic property becomes high). Accordingly, as the conductive particles contained in the conductive paste of the present invention, it is preferable to use a mixture of the flaky conductive particles and the spherical conductive particles. A preferable mixing ratio (weight ratio) of the flaky conductive particles and the spherical conductive particles is 0.25 to 4 of the spherical conductive particles based on 1 of the flaky conductive particles. It is more preferably 0.67 to 1.5 of the spherical conductive particles based on 1 of the flaky conductive particles. The most preferable mixing ratio of the flaky conductive particles and the spherical conductive particles is 1:1.

A preferred average particle diameter of the conductive particles is 0.1 µm to 15 µm, more preferably 0.5 µm to 10 µm, and most preferably 0.5 µm to 5 µm. In the present specification, the average particle diameter refers to an average particle diameter (an average particle diameter of 50% of the integrated value of all particles: D50) based on the standard of the number of particles by laser diffraction scattering type particle size distribution measurement. When the average particle diameter of the conductive particles is within the above-described range, the surface states of the electrode and the circuit pattern obtained by heating the conductive paste become good. In addition, electric characteristics of the electrode and the circuit pattern obtained by heating the conductive paste are improved.

A content of (A) the conductive component contained in the conductive paste of the present invention is preferably 75 to 98% by weight based on the whole conductive paste, more preferably 80 to 97% by weight, and further preferably 85 to 95% by weight.

As (A) the conductive component contained in the conductive paste of the present invention, (A) the conductive component is preferably at least one selected from silver (Ag) and copper (Cu). As (A) the conductive component, silver particles and/or copper particles can be used. Also, as (A) the conductive component, alloy particles of silver and copper can be used singly, or together with silver particles and/or copper particles. By using silver and/or copper that is/are a metal(s) having a low specific resistance, a conductive film having a low specific resistance can be obtained.

Conductivity of the silver particles is high. Therefore, silver particles have been conventionally used as an electrode for many semiconductor devices, for example, for a solar cell, and have high reliability. In the case of the conductive paste of the present invention a highly reliable and high-performance semiconductor device, for example, a solar cell can be manufactured by using silver particles as the conductive component. Therefore, it is preferable to use silver particles as a main component of the conductive component.

The copper particles are a relatively low cost and have high conductivity, so that they are preferable as an electrode material. A cost of the conductive paste can be reduced by using the copper particles as the conductive component.

In the conductive paste of the present invention, metal particles other than the silver particles and/or copper particles, or alloy particles with the silver particles and/or copper particles may be contained within the range which does not impair the properties of the application. From the viewpoint of obtaining low electric resistance and high reliability, the conductive component preferably contains the silver particles in an amount of 80% by weight or more based on the whole conductive component, more preferably contains 90% by weight or more, and further preferably the conductive component consists of the silver particles alone.

Furthermore, the terms "conductive component consists of the silver particles alone" mean that the whole parts of the conductive component substantially composed of silver particles except for inevitably existing impurities. That is, when the conductive component consists of the silver particles alone, the conductive component may contain inevitably existing impurities other than the silver particles. The same applies to the components other than the silver particles.

<(B) Thermosetting Resin>

The conductive paste of the present invention contains (B) an epoxy resin.

Examples of the epoxy resin may include a high molecular weight bisphenol A type epoxy resin, a branched polyfunctional bisphenol A type epoxy resin such as p-glycidyloxyphenyl dimethyltrisbisphenol A diglycidyl ether, a bisphenol F type epoxy resin, a biphenyl type epoxy resin such as diglycidylbiphenyl, a novolac type epoxy resin, a tetrabromobisphenol A type epoxy resin, a tris(hydroxyphenyl) methane type epoxy resin, an alicyclic epoxy resin such as vinyl (3,4-cyclohexene) dioxide, 3,4-Epoxycyclohexylcarboxylic acid (3,4-epoxycyclohexyl) methyl, bis(3,4-epoxy-6-methylcyclohexylmethyl) adipate and 2-(3,4-epoxycyclohexyl)5,1-spiro(3,4-epoxy-cyclohexyl)-m-dioxane, a glycidyl ester type epoxy resin such as diglycidyl hexahydro-phthalate, diglycidyl 3-methylhexahydrophthalate and diglycidyl hexahydrotere-phthalate, a glycidylamine type epoxy resin such as diglycidylaniline, diglycidyl-toluidine, triglycidyl-p-aminophenol, tetraglycidyl-m-xylylenediamine and tetraglycidylbis(aminomethyl)cyclohexane, a hydantoin type epoxy resin such as 1,3-diglycidyl-5-methyl-5-ethylhydantoin, and an epoxy resin having a silicone skeleton such as 1,3-bis(3-glycidoxypropyl)-1,1,3,3-tetramethyldisiloxane.

(B) The epoxy resin contained in the conductive paste of the present invention preferably contains at least one selected from a bisphenol F type epoxy resin, a biphenyl type epoxy resin and a bisphenol A type epoxy resin. (B) The epoxy resin preferably and substantially consists of at least one selected from a bisphenol F type epoxy resin, a biphenyl type epoxy resin and a bisphenol A type epoxy resin. Heat curing of the thermosetting resin can be carried out at a low temperature (for example, 250° C. or lower) by using the predetermined epoxy resin as (B) the epoxy resin.

<(C) Imidazole>

The conductive paste of the present invention contains (C) an imidazole.

In the conductive paste of the present invention, (C) the imidazole preferably contains at least one selected from imidazoles of the formula (1), the formula (2) and the formula (3).

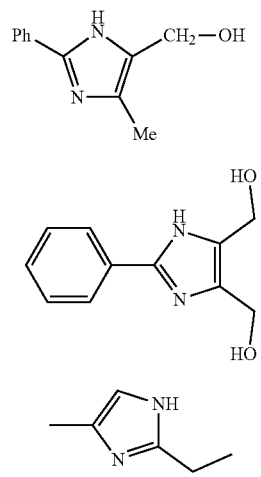

the formula (1)

Formula (2)

Formula (3)

When the conductive paste of the present invention contains at least one selected from imidazoles of the formula (1), the formula (2) and the formula (3), specific resistance of the obtainable conductive film (for example, an electrode of a solar cell) can be lower.

<(D) Solvent>

The conductive paste of the present invention contains (D) a solvent. By addition of (D) the solvent, a viscosity of the conductive paste can be adjusted.

Examples of the solvent contained in the conductive paste of the present invention may include an aromatic hydrocarbon such as toluene, xylene, mesitylene, tetralin and the like; an ether such as tetrahydrofuran and the like; a ketone such as methyl ethyl ketone, methyl isobutyl ketone, cyclohexanone, isophorone and the like; a lactam such as 2-pyrrolidone, 1-methyl-2-pyrrolidone and the like; an ether alcohol such as ethyl glycol monophenyl ether, ethylene glycol monomethyl ether, ethylene glycol monoethyl ether, ethylene glycol monobutyl ether, diethylene glycol monomethyl ether, diethylene glycol monoethyl ether, diethylene glycol monobutyl ether (butyl carbitol), and propylene glycol derivative corresponding to these and the like; an ester such as acetic acid ester corresponding to these (for example, butyl carbitol acetate) and the like; a diester such as a methyl ester or an ethyl ester of a dicarboxylic acid such as malonic acid, succinic acid and the like. Among these, at least one selected from ethyl glycol monophenyl ether and butyl carbitol acetate can be preferably used.

In the conductive paste of the present invention, (D) the solvent preferably contains ethyl diglycol monophenyl ether or butyl carbitol.

When (D) the solvent contains ethyl diglycol monophenyl ether or butyl carbitol, it can be more ensured to obtain a conductive film (for example, an electrode of a solar cell) having a low specific resistance. In addition, by using the predetermined solvent, a viscosity of the conductive paste can be more suitably adjusted and printing characteristics of the printed conductive film can be improved. Specifically, when the pattern of the conductive film is a fine line shape, a line width can be thin and constant, a film thickness can be constant and a shape can be high aspect ratio.

When the conductive paste of the present invention is coated onto the surface of a transparent conductive film or the like by screen printing, an apparent viscosity of the conductive paste at normal temperature is preferably 100 to 1,000 Pa·s, more preferably 200 to 800 Pa·s, and further preferably 300 to 600 Pa s. In addition, a value measured by using a Brookfield viscometer: HBD type (manufactured by Brookfield) at a rotation speed of 5 rpm and a temperature of 25° C. may be used as the viscosity. The viscosity of the conductive paste can be within the predetermined range by adjusting the formulation amount of (D) the solvent in the conductive paste.

<Other Components>

The conductive paste of the present invention may contain the following component(s) other than the above-described components (A), (B), (C) and (D).

The conductive paste of the present invention may contain a thermosetting resin(s) other than the epoxy resin. Examples of such a thermosetting resin may include an amino resin such as a urea resin, a melamine resin and a guanamine resin; an oxetane resin; a phenol resin such as a resole type phenol resin, an alkylresole type phenol resin, a novolac type phenol resin, an alkylnovolac type phenol resin and an aralkylnovolac type phenol resin; a silicone-modified resin such as silicone epoxy and silicone polyester, a bismaleimide, a polyimide resin and the like.

The conductive paste of the present invention may contain a thermoplastic resin. Examples of the thermoplastic resin may include a novolac type phenol resin, an allylphenol resin, a phenoxy resin, a butyral resin, a cellulose resin, an acrylic resin, a methacrylic resin, a polyester resin, a polyurethane resin, a polyamide resin, a thermoplastic xylene resin, a hydroxystyrene-based polymer, a cellulose derivative and a mixture of two or more kinds of these.

The conductive paste of the present invention preferably further contains (E) a phenol resin as a thermosetting resin or a thermoplastic resin. When the conductive paste of the present invention further contains (E) a phenol resin, thermal curing of the thermosetting resin at a low temperature (for example, 250° C. or lower) can be more assured.

The conductive paste of the present invention preferably further contains (F) a coupling agent. When the conductive paste further contains the coupling agent, adhesiveness of the inorganic component such as a conductive component or the like, and the thermosetting resin can be better.

The conductive paste of the present invention may further contain at least one selected from the group consisting of an inorganic pigment, an organic pigment, a leveling agent, a thixotropic agent and a defoaming agent.

<Method for Producing Conductive Paste>

A method for producing the conductive paste of the present invention is not particularly limited. The conductive paste of the present invention can be produced by charging the respective components with a predetermined formulation into a mixing machine such as a mortar machine, a propeller stirrer, a kneader, a three-roll mill, a pot mill and the like, and mixing.

The conductive paste of the present invention can be coated onto the surface of a transparent electrode or the like by a known method such as screen printing method or the like. After coating the conductive paste onto the surface of the transparent electrode or the like, the conductive paste is heated to a predetermined temperature and cured to form a conductive film.

A heating temperature for thermally curing the conductive paste is preferably a processing temperature at the time of forming an electrode of 250° C. or lower, and more preferably 200° C. or lower. Specifically, the heating temperature for thermally curing the conductive paste is preferably 60 to 250° C., more preferably 60 to 200° C., and further preferably 100 to 200° C.

A thickness of the conductive paste coated onto the surface of the transparent electrode or the like is preferably 10 to 100 μm, more preferably 15 to 80 μm, and further preferably 20 to 50 μm.

A conductive film obtained by heating the conductive paste of the present invention has characteristics that it has high adhesive strength to the substrate, low specific resistance (high conductivity), and low contact resistance. Therefore, by using the thermosetting conductive paste of the present invention, the semiconductor device or the like does not deteriorate by a high temperature and a good electrode to the semiconductor device or the like can be formed.

The conductive paste of the present invention can be used for forming an electrode, a circuit pattern and the like, of a semiconductor device and electronic parts. The conductive paste of the present invention can be used for forming a circuit pattern or an electrode not only on a semiconductor substrate, a ceramic substrate and the like, but also on a substrate having a low heat resistance such as PET (polyethylene terephthalate), PEN (polyethylene naphthalate) and the like.

When an electrode is formed on the surface of a transparent conductive film such as an ITO thin film and the like using the thermosetting conductive paste of the present invention, a low contact resistance can be obtained. In particular, when an electrode is formed on the ITO thin film, a low contact resistance (for example, contact resistance of 8 mΩ·cm² or less) can be obtained relatively easily. Accordingly, the thermosetting conductive paste of the present invention can be suitably used for forming an electrode on the surface of a transparent conductive film, in particular, a transparent electrode using an ITO thin film as a material.

The conductive paste of the present invention can be preferably used as a conductive paste for forming an electrode of a solar cell. The conductive paste of the present invention can be preferably used as a conductive paste for forming an electrode of a solar cell, in particular, using a thin film material such as an amorphous silicon-based and the like, for example, an amorphous silicon solar cell, a heterojunction solar cell and a compound semiconductor solar cell (CIS solar cell, CIGS solar cell, CdTe solar cell and the like). The thin film material such as amorphous silicon-based is weak to high temperatures. By using the conductive paste of the present invention, formation of an electrode at a relatively low temperature can be carried out. The conductive paste of the present invention can be particularly preferably used for forming an electrode of a heterojunction solar cell having a relatively high conversion efficiency as shown in FIG. 1.

In the conductive paste for forming an electrode of a solar cell of the present invention, a processing temperature at the time of forming an electrode is preferably 250° C. or lower, and more preferably 200° C. or lower. By carrying out formation of an electrode at such a temperature, an adverse effect on a thin film material that is weak to high temperatures can be suppressed.

EXAMPLES

In the following, Examples of the present invention and Comparative Examples will be explained.

[Preparation of Conductive Paste]

As starting materials of the conductive paste, materials shown in Table 4 were prepared. Tables 1 to 3 shows formulations of the materials of Examples 1 to 17 and Comparative Examples 1 to 6. Formulation ratios shown in Tables 1 to 3 are parts by weight when the weight of the conductive paste excluding (D) the solvent is 100 parts by weight. That is, the formulation ratios shown in Tables 1 to 3 are parts by weight of the respective components when the total weight of (A) the conductive component, (B) the epoxy resin, (C) the imidazole, (E) the phenol resin and (F) the coupling agent are 100 parts by weight.

(A) Conductive Component

Two kinds of silver particles A and B shown in Table 4 were used as conductive components in the formulations shown in Tables 1 to 3.

Silver particles A: Particle shape is flaky, and the average particle diameter is 3 μm.

Silver particles B: Particle shape is spherical, and the average particle diameter is 1 μm.

(B) Epoxy Resin

Three kinds of epoxy resins A, B and C shown in Table 4 were used as thermosetting resins in the formulations shown in Tables 1 to 3.

Epoxy resin A: Polyfunctional epoxy resin (trisphenol methane epoxy resin)

Epoxy resin B: Bisphenol F type epoxy resin

Epoxy resin C: Bisphenol A type epoxy resin (C) Imidazole

Three kinds of imidazoles A to C shown in Table 4 were used as imidazoles in the formulations shown in Tables 1 to 3. The imidazoles A to C are represented by the following chemical formulae.

Imidazole A: Imidazole of the following formula (1)

Formula (1)

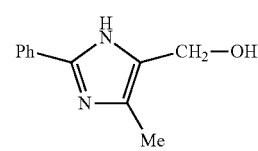

Imidazole B: Imidazole of the following formula (2)

Formula (2)

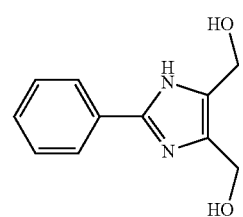

Imidazole C: Imidazole of the following formula (3)

Formula (3)

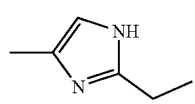

(D) Solvent

Two kinds of solvents A and B shown in Table 4 were used as solvents in the formulations shown in Tables 1 to 3.

(E) Phenol Resin

The phenoxy resin shown in Table 4 was used in the formulation shown in Tables 1 to 3.

(F) Coupling Agent

The coupling agent shown in Table 4 was used in the formulation shown in Tables 1 to 3.

The respective components of the above-described (A) to (F) were mixed with the weight ratio shown in Tables 1 to 3 to prepare conductive pastes of Examples 1 to 17 and Comparative Examples 1 to 6.

Next, the materials with the above-described predetermined preparation ratios were mixed with a planetary mixer, further dispersing the mixture with a three-roll mill and pasted to prepare a conductive paste.

[Measurement of Specific Resistance]

Specific resistances (electric resistivity) of the conductive films obtained by heating the conductive pastes of Examples 1 to 17 and Comparative Examples 1 to 6 were measured.

Figure 2:
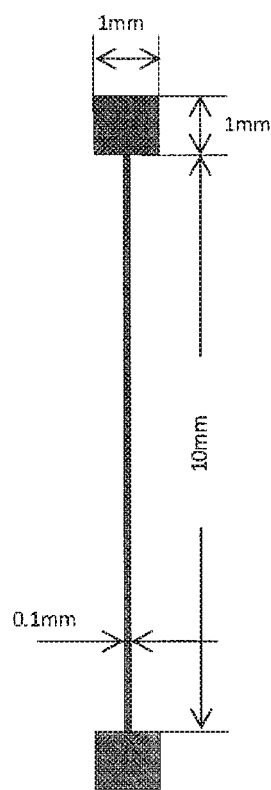
FIG. 2 is a plane schematic diagram showing a pattern for measuring a specific resistance for an electrode formed by using a conductive paste.

The specific resistances of Examples 1 to 17 and Comparative Examples 1 to 6 were measured by the following procedure. That is, an alumina substrate having a width of 15 mm, a length of 15 mm and a thickness of 200 μm was prepared. A pattern comprising a conductive paste shown in FIG. 2 was printed on the substrate using a 325 mesh screen made of stainless.

Next, the pattern comprising the conductive pastes of Examples 1 to 17 and Comparative Examples 1 to 6 coated on the substrate were heated to 200° C. for 30 minutes to obtain samples for measurement of specific resistance.

The specific resistances of the conductive film patterns of the samples for measuring specific resistance obtained by heating the conductive pastes of Examples 1 to 17 and Comparative Examples 1 to 6 were measured by the four terminal method using a multimeter type 2001 manufactured by TOYO Corporation. The measurement results are shown in Tables 1 to 3.

Furthermore, four samples with the same conditions were prepared as a sample for measuring the specific resistance, and the measured value was obtained as an average value of the four samples.

As clearly seen from Tables 1 to 3, the specific resistances (electric resistivity) of the conductive films obtained by using the conductive pastes of Examples 1 to 17 of the present invention were 9.8 μΩ·cm (Examples 1) or less. In general, when it has a specific resistance of 10 μΩ·cm or less, it can be said that it is suitably used as an electrode. To the contrary, specific resistances (electric resistivity) of the conductive films obtained by using the conductive pastes of Comparative Examples 1 to 6 were in the range of 10.3 μΩ·cm (Comparative Example 3) to 13.2 μΩ·cm (Comparative Example 1). Accordingly, it is clear that a lower specific resistance can be obtained by forming a conductive film using the conductive pastes of Examples 1 to 17 of the present invention.

[Measurement of Contact Resistance]

Using the conductive pastes of Examples 1 to 17 and Comparative Examples 1 to 6, an electrode was each formed on the surface of a crystalline silicon substrate having a transparent conductive film, and a contact resistance was measured. Specifically, each of a pattern for measuring the contact resistance using the conductive pastes of Examples 1 to 17 and Comparative Examples 1 to 6 was screen printed on the transparent conductive film formed on the surface of the crystalline silicon substrate and heated to obtain an electrode for measuring the contact resistance.

As a substrate, an n-type crystalline silicon substrate (thickness of the substrate: 200 μm) was used.

Next, a transparent conductive film was formed on the surface of the n-type crystalline silicon substrate. Specifically, an indium tin oxide thin film (ITO thin film) was formed by using a sputtering target containing indium oxide and tin oxide by the sputtering method. A sheet resistance of the obtained ITO thin film was 80Ω/square. The substrate for measuring the contact resistance thus obtained was used for producing an electrode for measuring the contact resistance.

Figure 3:
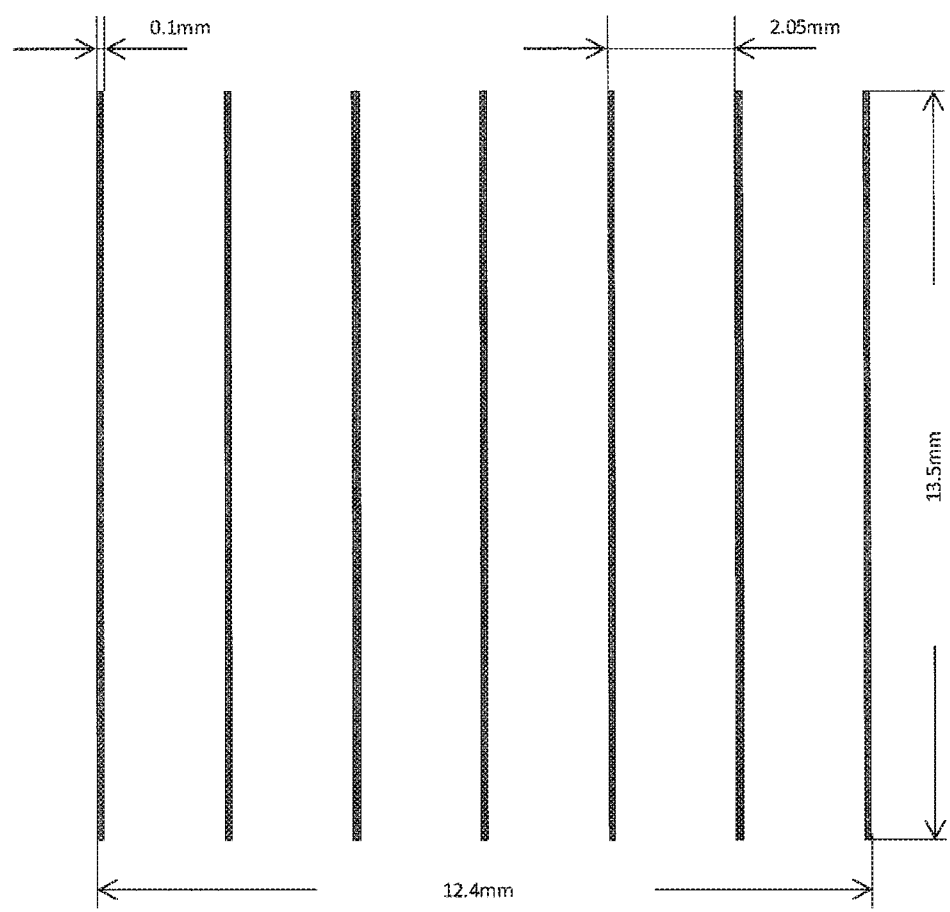
FIG. 3 is a plane schematic diagram showing a pattern for measuring a contact resistance used for measurement of a contact resistance between an electrode and a crystalline silicon substrate.

Printing of the conductive paste on the substrate for measuring the contact resistance was carried out by the screen printing method. The pattern for measuring the contact resistance was printed on the above-described substrate so that the film thickness became about 30 μm, thereafter, the material was heated at 200° C. for 30 minutes to obtain a sample for measuring the contact resistance. FIG. 3 shows a plane schematic diagram of the pattern for measuring the contact resistance used for measurement of the contact resistance. The pattern for measuring the contact resistance shown in FIG. 3 is a pattern in which seven rectangular electrode patterns having a width of 0.1 mm and a length of 13.5 mm are arranged with a pitch interval of 2.05 mm.

As the sample for measuring the contact resistance, three samples with the same conditions were prepared, and the measured value was obtained as an average value of the three samples.

The contact resistance was obtained by the TLM method (Transfer length Method) measuring the electric resistance between the predetermined rectangular electrode patterns shown in FIG. 3 using GP 4TEST Pro manufactured by GP Solar GmbH. When the contact resistance is 10 mΩ·cm$^2$ or less, it can be used as an electrode on a transparent conductive film. When the contact resistance is 8 mΩ·cm$^2$ or less, it can be preferably used as an electrode on a transparent conductive film.

As clearly seen from Tables 1 to 3, the contact resistances of the conductive films to the transparent conductive film (ITO thin film) obtained by using the conductive pastes of Examples 1 to 17 and Comparative Examples 1 to 6 were 7.9 mΩ·cm$^2$ (Example 1) or less. Accordingly, with regard to the contact resistances of Examples 1 to 17, it can be said that there are within a numerical range that can be preferably used as an electrode on a transparent conductive film. Furthermore, with regard to Comparative Examples 1 to 6, the specific resistances were high values but the contact resistances can be said to be good values.

<Measurement of Soldering Adhesive Strength>

As one of the evaluations of the conductive paste of the present invention, soldering adhesive strength was measured. A crystalline silicon substrate having a transparent conductive film, which is similar to the case of the above-described measurement of the contact resistance, was used as the substrate for measuring the soldering adhesive strength. An electrode pattern imitating a solar cell electrode was formed on the surface of the substrate, and the contact resistance was measured.

A crystalline silicon substrate having a transparent conductive film was cut to a square of 15 mm×15 mm and used.

Printing of the conductive paste for forming an electrode pattern was carried out by the screen printing method. Using the conductive pastes of Examples and Comparative Examples shown in Table 1, Table 2 and Table 3, an electrode pattern having a length of 1.3 mm and a width of 2 mm was printed on a transparent conductive film of the above-described substrate so that the film thickness became about 20 μm, and the electrode pattern was heated to obtain an electrode for measuring the soldering adhesive strength.

A sample for measuring the adhesive strength of the soldered metal ribbon was prepared and measured as follows. A copper ribbon (a width of 1.5 mm×total thickness of 0.16 mm, eutectic solder [weight ratio of tin:lead=64:36] was coated with a film thickness of about 40 μm) that is a metal ribbon for interconnection was soldered to an electrode formed on the above-described substrate having a square of 15 mm for measuring the soldering adhesive strength, by soldering using a flux on a soldering pad at a temperature of 250° C. for 3 seconds to obtain a sample for measuring adhesive strength. Thereafter, the ring-shaped portion provided at one end of the ribbon was pulled in a direction of 90° to the surface of the substrate by a digital tension gauge (Digital force gauge AD-4932-50N manufactured by A & D Company, Limited), and breaking strength of the adhesion was measured to carry out measurement of the soldering adhesive strength. Furthermore, ten samples were prepared, and the measured value was obtained as an average value of the ten samples. Furthermore, when the adhesive strength of the metal ribbon is larger than 1 N/mm, it can be said that it is good adhesive strength which can endure use.

The measurement results of the soldering adhesive strength are shown in the row of "Adhesive strength" in Tables 1 to 3.

As clearly seen from Tables 1 to 3, the soldering adhesive strengths of the conductive films obtained by using the conductive pastes of Examples 1 to 17 were 1.31 N/mm (Example 1) or more. Accordingly, with regard to the soldering adhesive strengths of Examples 1 to 17, it can be said that they are good adhesive strength which can endure use. Furthermore, the soldering adhesive strengths of the conductive films obtained by using the conductive pastes of Comparative Examples 1 and 2 were 0.62 N/mm and 0.70 N/mm, respectively. Accordingly, with regard to the soldering adhesive strengths of Comparative Examples 1 and 2, it cannot be said that they are good adhesive strength which can endure use.

[Evaluation of Printing Characteristics]

Evaluation of printing characteristics was carried out by measuring the shape of the above-described pattern for measuring the contact resistance. Measurement of the shape of the pattern for measuring the contact resistance was carried out by using a confocal microscope OPTELICS H1200 manufactured by Lasertec Corporation and a surface roughness shape measuring instrument 1500SD2. As shown by the symbol "○" in Tables 1 to 3, printing characteristics of the conductive pastes of Examples 1 to 17 and Comparative Examples 1 to 6 onto the surface of the transparent conductive (ITO thin film) were good.

TABLE 1

| | | Comparative Example 1 | Comparative Example 2 | Example 1 | Example 2 | Example 3 | Example 4 | Example 5 | Comparative Example 3 |
|---|---|---|---|---|---|---|---|---|---|
| Conductive component | Silver particles A | 96 | 96 | 96 | 96 | 96 | 96 | 96 | 96 |
| | Silver particles B | | | | | | | | |
| Epoxy resin | Epoxy resin A | 4 | 3.95 | 3.9 | 3.85 | 3.7 | 3.4 | 3 | 2.9 |
| | Epoxy resin B | | | | | | | | |
| | Epoxy resin C | | | | | | | | |
| Imidazole | Imidazole A | 0 | 0.05 | 0.1 | 0.15 | 0.3 | 0.6 | 1 | 1.1 |
| | Imidazole B | | | | | | | | |
| | Imidazole C | | | | | | | | |
| Solvent | Solvent A | 6.7 | 6.7 | 6.7 | 6.7 | 6.6 | 6.5 | 7.3 | 7.2 |
| | Solvent B | | | | | | | | |
| Phenol resin | | | | | | | | | |
| Coupling agent | | | | | | | | | |
| Measurement results | Specific resistance (μΩ · cm) | 13.2 | 12.5 | 9.8 | 7.3 | 6.9 | 6.7 | 7.4 | 10.3 |
| | Adhesion strength (N/mm) | 0.62 | 0.7 | 1.31 | 1.31 | 2.8 | 2.38 | 2.99 | 2.38 |
| | Contact resistance (mΩ · cm²) | 6.1 | 7.4 | 7.9 | 6.3 | 5.5 | 5.1 | 7.5 | 6.2 |
| | Printing characteristics | ○ | ○ | ○ | ○ | ○ | ○ | ○ | ○ |

TABLE 2

| | | Comparative Example 4 | Example 6 | Example 7 | Example 8 | Example 9 | Comparative Example 5 | Example 10 | Example 11 |
|---|---|---|---|---|---|---|---|---|---|
| Conductive component | Silver particles A | 96 | 96 | 96 | 96 | 96 | 96 | 96 | 96 |
| | Silver particles B | | | | | | | | |
| Epoxy resin | Epoxy resin A | 2.8 | 3.4 | 1.04 | 0.97 | 0.92 | 0.68 | 1.04 | 0.97 |
| | Epoxy resin B | | | 0.52 | 0.52 | 0.46 | 0.34 | 0.52 | 0.52 |
| | Epoxy resin C | | | 0.53 | 0.52 | 0.46 | 0.34 | 0.53 | 0.52 |
| Imidazole | Imidazole A | 1.2 | | 0.15 | 0.3 | 0.6 | 1.5 | | |
| | Imidazole B | | 0.6 | | | | | 0.15 | 0.3 |
| | Imidazole C | | | | | | | | |
| Solvent | Solvent A | 7.1 | 6.5 | | | | | | |
| | Solvent B | | | 4.2 | 3.4 | 3.3 | 3 | 4.3 | 3.4 |
| Phenol resin | | | | 1.76 | 1.69 | 1.56 | 1.14 | 1.76 | 1.69 |
| Coupling agent | | | | | | | | | |
| Measurement results | Specific resistance (μΩ·cm) | 10.9 | 6.2 | 7.1 | 7.3 | 7.8 | 12.5 | 7.3 | 6.3 |
| | Adhesion strength (N/mm) | 2.38 | 2.27 | 2.05 | 3 | 2.23 | 1.81 | 1.95 | 2.6 |
| | Contact resistance (mΩ·cm$^2$) | 5.9 | 6.2 | 5.7 | 5.1 | 7.3 | 6.6 | 6.8 | 5.3 |
| | Printing characteristics | ○ | ○ | ○ | ○ | ○ | ○ | ○ | ○ |

TABLE 3

| | | Example 12 | Comparative Example 6 | Example 13 | Example 14 | Example 15 | Example 16 | Example 17 |
|---|---|---|---|---|---|---|---|---|
| Conductive component | Silver particles A | 96 | 96 | 97 | | | | 96 |
| | Silver particles B | | | | 97 | 97 | 97 | |
| Epoxy resin | Epoxy resin A | 0.92 | 0.68 | 1.61 | 1.61 | 1.61 | 1.61 | 3.2 |
| | Epoxy resin B | 0.46 | 0.34 | | | | | |
| | Epoxy resin C | 0.46 | 0.34 | | | | | |
| Imidazole | Imidazole A | | | | 0.3 | | | 0.6 |
| | imidazole B | 0.6 | 1.5 | | 0.3 | | | |
| | Imidazole C | | | 0.3 | | 0.3 | | |
| Solvent | Solvent A | | | 8.3 | 8.3 | 8.3 | 8.3 | 6.5 |
| | Solvent B | 3.3 | 3 | | | | | |
| Phenol resin | | 1.56 | 1.14 | 1.09 | 1.09 | 1.09 | 1.09 | |
| Coupling agent | | | | | | | | 0.2 |
| Measurement results | Specific resistance (μΩ·cm) | 7.8 | 12.4 | 6.2 | 5.4 | 5.6 | 5.6 | 6.7 |
| | Adhesion strength (N/mm) | 1.94 | 1.45 | 2.12 | 1.79 | 1.83 | 1.71 | 2.16 |
| | Contact resistance (mΩ·cm$^2$) | 7.1 | 6.2 | 6.6 | 7 | 5.8 | 6.4 | 7.3 |
| | Printing characteristics | ○ | ○ | ○ | ○ | ○ | ○ | ○ |

TABLE 4

| Component | Kind | Type, No., etc. | Manufacturer |
|---|---|---|---|
| Conductive component | Silver particle A (Flaky silver particles) | FA-D-5 | DOWA Electronics Materials Co., Ltd. |
| | Silver particle B (Spherical silver particles) | AG 2-1C | DOWA Electronics Materials Co., Ltd. |
| Epoxy resin | Epoxy resin A | 154 (Phenol novolac type epoxy resin) | Mitsubishi Chemical Corporation |
| | Epoxy resin B | EXA835LV | DIC CORPORATION |
| | Epoxy resin C | 1009 | Mitsubishi Chemical Corporation |
| Imidazole | Imidazole A | 2P4MHZ-PW | Shikoku Chemicals Corporation |
| | Imidazole B | 2PHZ-PW | Shikoku Chemicals Corporation |
| | Imidazole C | 2E4MZ | Shikoku Chemicals Corporation |
| Solvent | Solvent A (Ethylene glycol monophenyl ether) | Hi-Solv EPH | TOHO Chemical Industry Co,, Ltd. |
| | Solvent B (Butyl carbitol acetate) | BCA | Wako Pure Chemistry Co., Ltd. |
| | Phenol resin | MEI-18000H | Meiwa Plastic Industries, Ltd. |
| | Coupling agent (3-Glycidoxy-propyltriethoxysilane) | KM-403 | Shin-Etsu Chemical Co., Ltd. |

BRIEF DESCRIPTION OF REFERENCE SYMBOLS

10 Crystalline silicon substrate
12 i-type amorphous silicon layer
14a p-type amorphous silicon layer
14b n-type amorphous silicon layer
16 Transparent conductive film
18a. Light incident side electrode
18b Back surface electrode

The invention claimed is:

1. A conductive paste for forming a solar cell, wherein the conductive paste comprises (A) a conductive component, (B) an epoxy resin, (C) an imidazole, (D) a solvent, and (E) a phenol resin, wherein an amount of (C) the imidazole in the conductive paste is 0.1 to 1.0% by weight based on 100% by weight of the conductive paste excluding (D) the solvent, wherein (C) the imidazole contains at least one imidazole selected from imidazoles of the following formula (1) and formula (2):

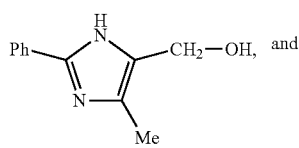

Formula (1)

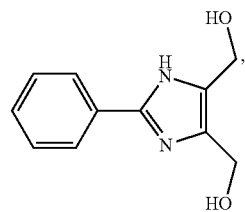

Formula (2)

and
wherein (B) the epoxy resin comprises a bisphenol F type epoxy resin, a biphenyl type epoxy resin and a bisphenol A type epoxy resin.

2. The conductive paste according to claim 1, wherein (D) the solvent comprises ethyl diglycol monophenyl ether or diethylene glycol monobutyl ether.

3. The conductive paste according to claim 1, which further comprises (F) a coupling agent.

4. The conductive paste according to claim 1, wherein (D) the solvent comprises diethylene glycol monobutyl ether acetate.

5. The conductive paste according to claim 1, wherein (A) the conductive component comprises conductive particles of at least one selected from silver, copper, nickel, aluminum, zinc and tin.

6. The conductive paste according to claim 1, wherein (A) the conductive component contained in the conductive paste is 75 to 98% by weight based on the whole conductive paste.

7. The conductive paste according to claim 1, wherein (E) the phenol resin contained in the conductive paste is 1.56 to 1.76% by weight based on the total weight of (A) the conductive component, (B) the epoxy resin, (C) the imidazole, (E) the phenol resin and (F) a coupling agent.

* * * * *